United States Patent
Sakai et al.

[11] Patent Number: 6,034,449
[45] Date of Patent: Mar. 7, 2000

[54] LOAD DRIVE CIRCUIT

[75] Inventors: Masayoshi Sakai; Koichi Futsuhara, both of Urawa, Japan

[73] Assignee: The Nippon Signal Co., Ltd., Tokyo, Japan

[21] Appl. No.: 09/068,032

[22] PCT Filed: Jun. 12, 1997

[86] PCT No.: PCT/JP97/02038

§ 371 Date: Nov. 18, 1998

§ 102(e) Date: Nov. 18, 1998

[87] PCT Pub. No.: WO98/10452

PCT Pub. Date: Mar. 12, 1998

[30] Foreign Application Priority Data

Sep. 3, 1996 [JP] Japan ................................. 8-233244

[51] Int. Cl.[7] ................................................ H01H 3/00
[52] U.S. Cl. .................... 307/139; 307/141.4; 307/141.8
[58] Field of Search ................................ 307/112, 113, 307/116, 125, 126, 130, 131, 139, 141, 141.4, 141.8; 361/18, 79, 86, 93, 187; 340/657, 660, 664

[56] References Cited

U.S. PATENT DOCUMENTS

| | | | |
|---|---|---|---|
| 4,685,020 | 8/1987 | Driscoll et al. | 361/18 |
| 5,568,347 | 10/1996 | Shirai et al. | 361/98 |
| 5,574,320 | 11/1996 | Shirai et al. | 307/131 |
| 5,612,582 | 3/1997 | Shichi et al. | 307/130 |
| 5,668,706 | 9/1997 | Sakai et al. | 363/21 |

FOREIGN PATENT DOCUMENTS

| | | |
|---|---|---|
| 5-4656 | 2/1993 | Japan . |
| 5-325766 | 12/1993 | Japan . |
| WO 96/30923 | 10/1996 | Japan . |

*Primary Examiner*—Jeffrey Gaffin
*Assistant Examiner*—Peter Zura
*Attorney, Agent, or Firm*—Finnegan, Henderson, Farabow & Garrett & Dunner, L.L.P.

[57] ABSTRACT

The invention relates to a load drive circuit wherein an emergency shutdown switch for forcible interruption and a normal shutdown switch for normal current control are disposed in series in a load power supply circuit. An emergency shutdown switch ($SW_A$) and a normal shutdown switch ($SW_B$) are disposed in series in a load power supply circuit. The normal shutdown switch ($SW_B$) is periodically driven off for a short time by means of a control signal (X) from a normal shutdown switch control circuit (30), and the fact that this is off is monitored by an output signal (AC) from a monitoring circuit (40). If the output signal (AC) is not generated for an off-delay time or more of an off-delay circuit (21), then a control signal (Z) for an emergency shutdown switch control circuit (20) is stopped thereby forcibly switching off the emergency shutdown switch ($SW_A$).

7 Claims, 8 Drawing Sheets

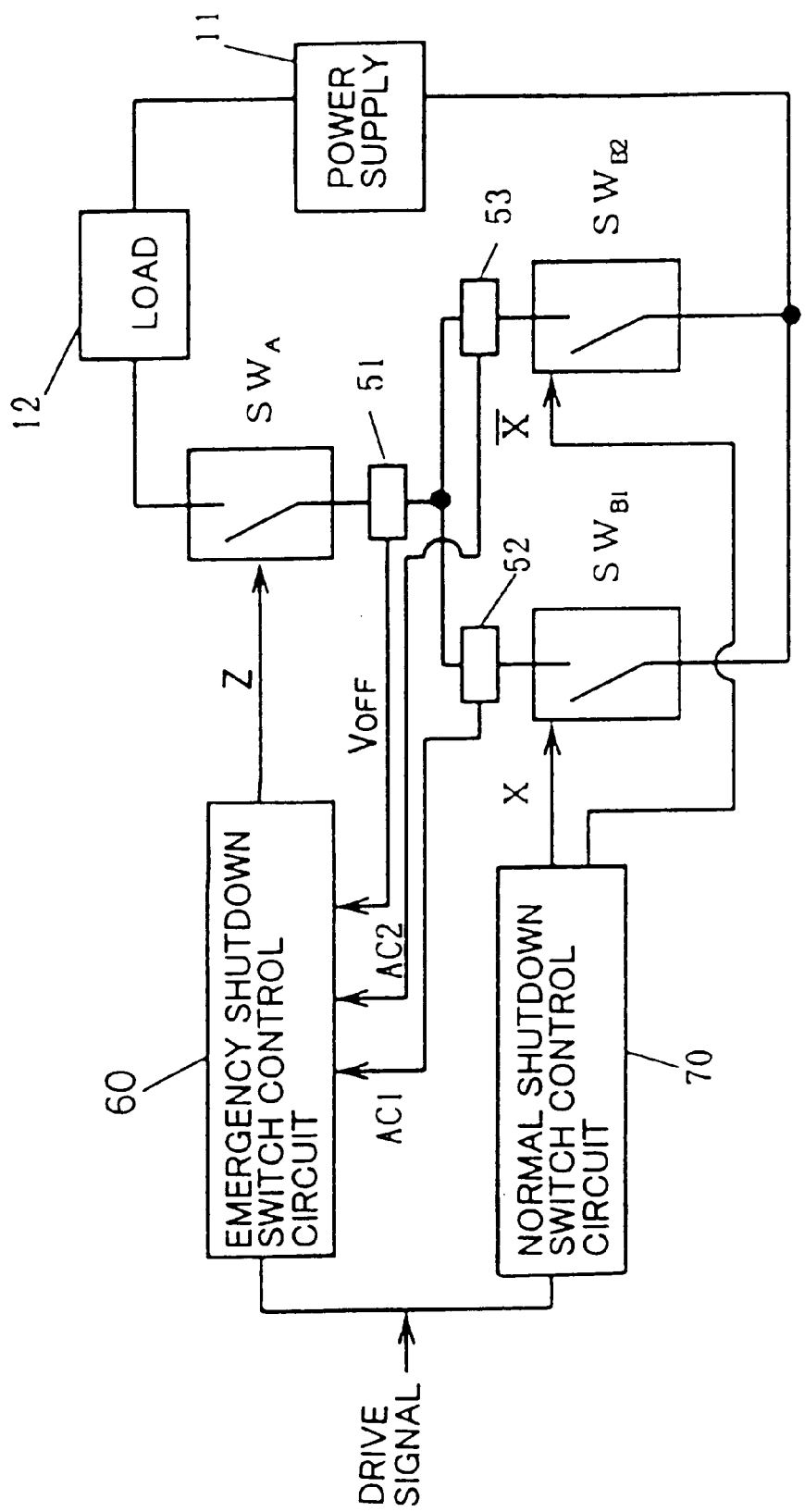

ent invention provides a load circuit which
can check if the normal shutdown switch can switch the
current OFF during load drive and without stopping load
drive.

LOAD DRIVE CIRCUIT

TECHNICAL FIELD

The present invention relates to a load drive circuit
wherein a normal shutdown switch for direct ON/OFF
switching of a load current for supply to a load, and an
emergency shutdown switch for forcibly interrupting the
load current at the time of an ON fault in the normal
shutdown switch are connected in series.

BACKGROUND ART

The load circuit of the present invention is disclosed in
PCT/JP96/00866. PCT/JP96/00866 is incorporated herein
by reference.

In a conventional load drive circuit, the normal shutdown
switch and the emergency shutdown switch are disposed in
series in a load power supply circuit. An ON/OFF control
signal for the emergency shutdown switch which is based on
the occurrence of a drive signal for a load, is applied to the
emergency shutdown switch via an off-delay circuit.
Moreover, an ON/OFF control signal for the normal shut-
down switch is based on the occurrence of the drive signal
is applied to the normal shutdown switch via an on-delay
circuit.

A description will now be given of the operation of the
conventional circuit.

The ON/OFF control signal for the emergency shutdown
switch is generated from the off-delay circuit simultaneously
with the application of the drive signal. Meanwhile the
ON/OFF control signal for the normal shutdown switch is
generated after an on-delay time delay of the on-delay
circuit from the application of the drive signal. When the
drive signal is terminated, the ON/OFF control signal for the
emergency shutdown switch is stopped after an off-delay
time delay. This off-delay time delay is determined from the
moment of termination of the drive signal. Meanwhile, the
ON/OFF control signal for the normal shutdown switch is
stopped simultaneously with the termination of the drive
signal. Consequently, when conditions are normal, the emer-
gency shutdown switch does not directly switch the current
ON or OFF. Rather, the load current is switched ON or OFF
by means of the normal shutdown switch. Furthermore, in
the case where the load current cannot be interrupted due to
contact point fusion in the normal shutdown switch, the
emergency shutdown switch is forcibly switched off in order
to interrupt the load current thereby forcibly stopping opera-
tion of the load.

With the conventional circuit however, a fusion or short
circuit fault of the normal shutdown switch cannot be
determined unless the drive signal is off. However, under
conditions when the drive signal is being generated and the
normal shutdown switch is on, the capacity to interrupt the
load current may be actually lost due to, for example, a
fusion fault. Moreover, in the case where the normal shut-
down switch has a short circuit fault and the load current is
interrupted by the emergency shutdown switch, the off-delay
time control signal from the off-delay circuit continues from
the point in time of termination of the drive signal. Thus the
OFF operation of the emergency shutdown switch is
delayed. Subsequently, the OFF response of the load current
is delayed. This is inevitable with a switch circuit where the
current is not directly ON/OFF switched by the emergency
shutdown switch.

The object of the present invention is to overcome these
and other disadvantages of the conventional load drive
circuit. The present invention provides a load circuit which
can check if the normal shutdown switch can switch the
current OFF during load drive and without stopping load
drive.

SUMMARY OF THE INVENTION

The present invention overcomes the limitations of the
conventional load drive circuit by providing a load drive
circuit, wherein a series circuit of an emergency shutdown
switch that switches on simultaneously with the generation
of a load drive signal and switches off after a predetermined
off-delay time from the termination of the load drive signal,
and a normal shutdown switch that switches on after a
predetermined on-delay time from the generation of said
drive signal and switches off simultaneously with the ter-
mination of the drive signal, is connected in series with a
load power supply circuit. In addition, a monitoring device
is provided for monitoring, during load power supply, the
ability of the normal shutdown switch to be switched off.

With such a construction, the ability of the normal shut-
down switch to be switched off is continuously monitored by
the monitoring device when both the emergency shutdown
switch and the normal shutdown switch are both switched on
to provide load current. In this way, it is possible to avoid the
risk that the normal shutdown switch for direct ON/OFF
control of the load current cannot be switched off (due to a
short circuit fault or the like).

Moreover, an embodiment consistent with the present
invention provides a normal shutdown switch that comprises
a semiconductor switch. In this embodiment, a monitoring
device comprises an OFF signal generating device for
periodically generating an OFF drive signal for switching
the normal shutdown switch off for a short enough period of
time so that the load current is not stopped, and an OFF
verification device for generating an output signal when the
normal shutdown switch is switched off.

With such a construction, the high speed ON/OFF control
of the normal shutdown semiconductor switch allows for the
normal shutdown switch to be effectively switched off
without stopping the load current. Thus, the present inven-
tion allows for verification of the OFF operation of the
normal shutdown switch.

Furthermore, another embodiment consistent with the
present invention provides a normal shutdown switch that
comprises first and second normal shutdown switches con-
nected in parallel with one another, the monitoring device
also comprises a drive device for generating output signals
having a mutually complementary relationship for alter-
nately ON/OFF driving the first and second normal shut-
down switches, and first and second OFF verification
devices for generating an OFF verification signal when the
first and second normal shutdown switches are respectively
switched off.

In this manner, if the two normal shutdown switches are
normal, then the two normal shutdown switches alternately
switch on and off so that a current flows continuously in the
load power supply circuit. Moreover, it is possible to verify
the OFF operation of the respective normal shutdown
switches.

Furthermore, the present invention provides an emer-
gency shutdown switch control device for continuously
generating an ON drive signal for the emergency shutdown
switch on the condition that an OFF verification signal is
being alternately generated from the first and second OFF
verification devices.

With such a construction, the emergency shutdown switch
is held in the on condition only when the normal shutdown switches are normally switching alternately on and off. If one of the normal shutdown switches does not switch off, the emergency shutdown switch is forcibly switched off by the emergency shutdown switch control device, thereby stopping power supply to the load.

In particular, the emergency shutdown switch control device is constructed such that the ON drive signal for the emergency shutdown switch is generated with the input of the drive signal on the condition that on OFF verification signal indicating that the two normal shutdown switches are both off is generated, and subsequently, the ON drive signal for the emergency shutdown switch is continuous on the condition that an OFF verification signal is alternately generated from the first and second OFF verification devices.

Furthermore, an embodiment consistent with the present invention provides first and second normal shutdown switches which are drive controlled so that the mutual switch ON periods overlap, at the time of ON/OFF switching of the first and second normal shutdown switches, when the first and second normal shutdown switches are mechanical type contact point switches.

With such a construction, at the time of ON/OFF switching of the normal shutdown switches, while one normal shutdown switch is on the other normal shutdown switch is switched on. Subsequently, the one normal shutdown switch goes from on to off. As a result, the load drive remains stable even though mechanical type contact point switches that have slow ON/OFF switching response speeds are used. Moreover, the load on the mechanical type contact point switch at the time of ON/OFF switching is minimal and hence the life of the switches may be extended.

BRIEF DESCRIPTION OF THE DRAWINGS

FIG. 4 is an overall structural diagram of a second embodiment of the present invention;

DETAILED DESCRIPTION OF THE PRESENT INVENTION

The following is a description of the embodiments of the load drive circuit according to the present invention, with reference to the drawings.

Figure 1:
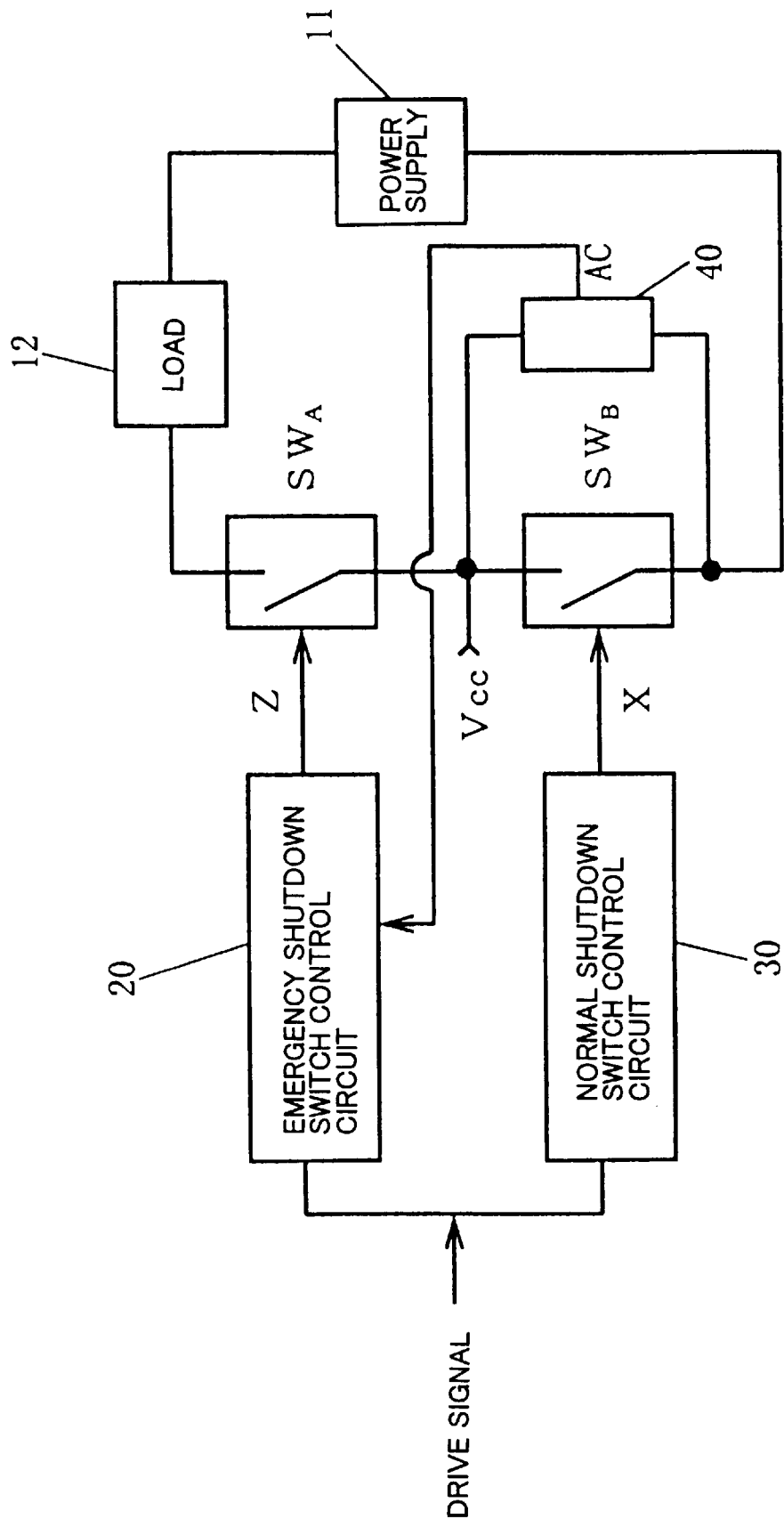
FIG. 1 is an overall structural diagram of a first embodiment of the present invention.

In FIG. 1, as in the conventional technique, a load drive circuit of the first embodiment has a series circuit of an emergency shutdown switch $SW_A$ and a normal shutdown switch $SW_B$ connected in series with a load power supply circuit for supplying power to a load 12 and from a power supply 11. The emergency shutdown switch $SW_A$ comprises a make contact point of a forced operation type electromagnetic relay (refer for example to PCT/JP96/00866) having a make contact point and break contact point with the ON and OFF operation thereof having a mutually complementary relationship. This is driven ON/OFF by means of a control signal Z from an emergency shutdown switch control circuit 20 serving as an emergency shutdown switch control device to be described later. The normal shutdown switch $SW_B$ in the present embodiment is a semiconductor switch, and is driven ON/OFF by means of a control signal X from a normal shutdown switch control circuit 30 to be described later. The normal shutdown switch $SW_B$ is periodically switched OFF for a period of time so extremely short that the operation of the load 12 is not stopped during load power supply. A monitor circuit 40 serving as an OFF verification device for verifying the OFF operation of the normal shutdown switch $SW_B$ outputs an output signal AC when the normal shutdown switch $SW_B$ is OFF. The emergency shutdown switch control circuit 20 continuously generates a control signal Z to maintain the emergency shutdown switch $SW_A$ in the ON condition, on the proviso that the output signal AC from the monitor circuit 40 is being generated during load power supply.

Figure 2:
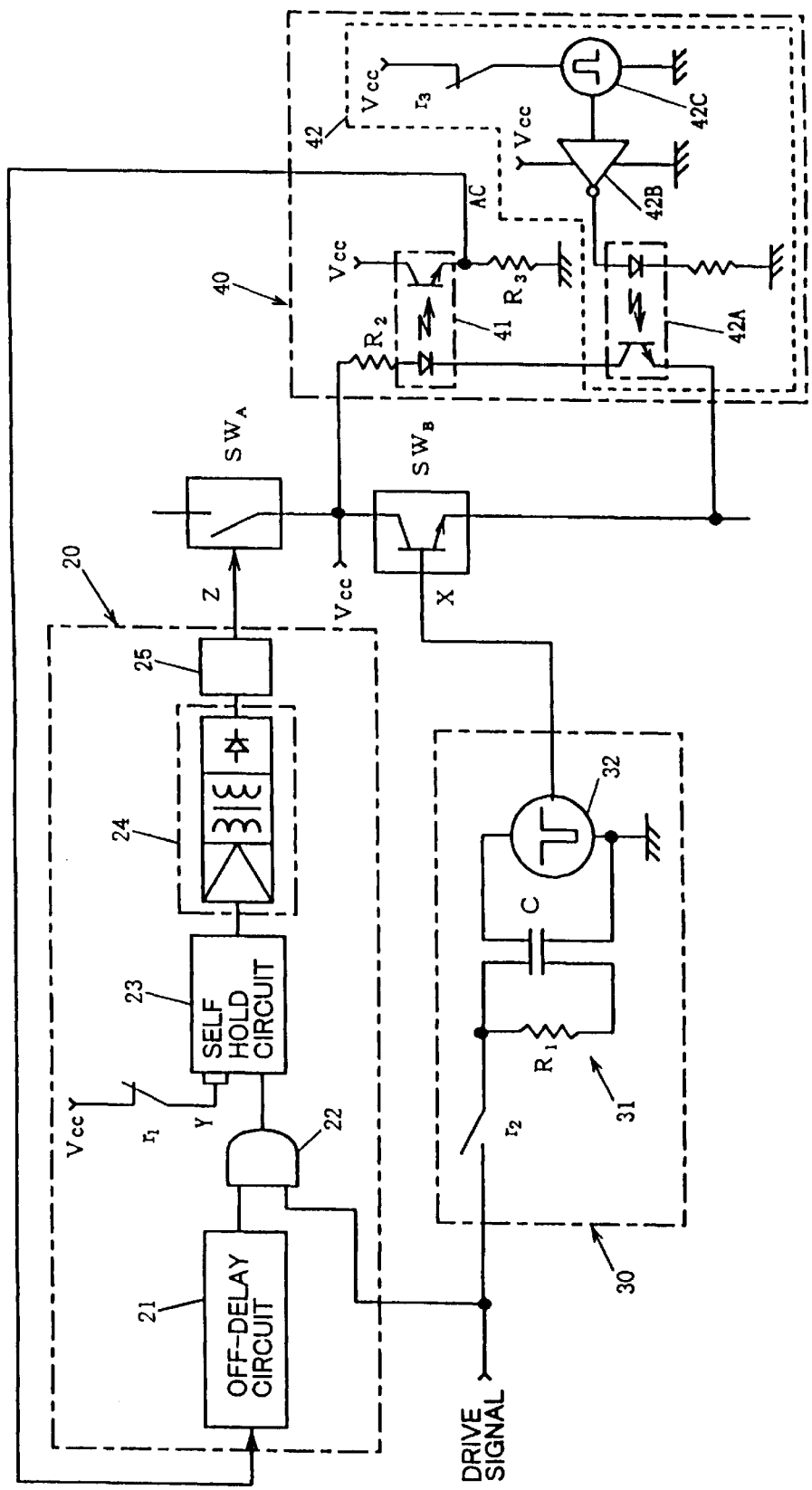
FIG. 2 is an emergency and normal shutdown switch control circuit diagram for the circuit of FIG. 1.

FIG. 2 shows a specific construction example for the emergency shutdown switch control circuit 20, the normal shutdown switch control circuit 30, and the monitor circuit 40.

The emergency shutdown switch control circuit 20 comprises; an off-delay circuit 21 for time delaying an off-delay time Tz for terminating the output signal AC from the monitor circuit 40, an AND gate 22 into which is input the output from the off-delay circuit 21 and a drive signal, a self hold circuit 23 with the output from the AND gate 22 as a hold signal and an OFF verification signal Y of the emergency shutdown switch $SW_A$ which is generated when a break contact point $r_1$ of the emergency shutdown switch $SW_A$ is on as a trigger signal, a relay driver 24 comprising an amplifier, a transistor, and a rectifying circuit, and a fail-safe off-delay circuit 25 which uses a four terminal capacitor for time delaying an off-delay time $T_{OFF}$ for terminating the output from the relay driver 24 and generating a control signal Z.

The normal shutdown switch control circuit 30 comprises; an on-delay circuit 31 comprising a resistor $R_1$ and a four terminal capacitor C which delays a drive signal input via a different make contact point $r_2$ of the emergency shutdown switch $SW_A$ by an on-delay time $T_{ON}$, and an oscillator 32 which is driven by the output from the on-delay circuit 31 serving as a power supply and which outputs a control signal X with a pulse shape which is OFF for $\Delta t$ at a period $T_Z$.

The monitor circuit 40 comprises; a photocoupler 41 comprising a photodiode connected in parallel with the normal shutdown switch $SW_B$ and to which a constant voltage Vcc is applied via a resistor $R_2$, and a phototransistor which receives a light signal from the photodiode and gives an output, and a modulating circuit 42 for checking the OFF condition of the normal shutdown switch $SW_B$ when there is no drive signal. The modulating circuit 42 comprises; a photocoupler 42A, an inverter 42B, an oscillator 42C, and a break contact point $r_3$ of the emergency shutdown switch $SW_A$. With the operation, when the drive signal is not input so that the emergency shutdown switch $SW_A$ is not on, then the break contact point $r_3$ comes on to drive the oscillator 42C thus switching the photocoupler 42A with the output from the inverter 42B. If the normal shutdown switch $SW_B$ is off, then the photocoupler 41 switches giving an output signal AC so that the off-delay circuit 21 generates an output. When the drive signal is applied so that the emergency shutdown switch $SW_A$ comes on and the break contact point $r_3$ thereof goes off, then the operation of the oscillator 42C stops and the output from the inverter 42B is fixed at a voltage Vcc so that the phototransistor of the photocoupler 42A continues in the ON condition. Consequently, there is no influence on the operation of the photocoupler 41 to be described later.

The oscillator 32 corresponds to an OFF signal generating device for the normal shutdown switch $SW_B$ (while the drive signal is being applied), and the oscillator 32 and the monitor circuit 40 constitute the monitoring device for monitoring that the normal shutdown switch $SW_B$ is able to be switched off. Incidentally, $R_3$ is a resistor.

Figure 3:
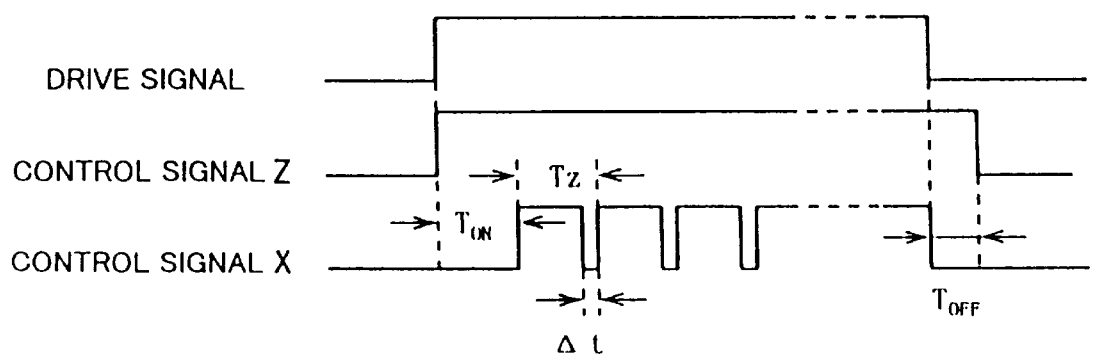
FIG. 3 is an operational time chart for the invention of FIG. 1.

Next is a description of the operation, with reference to the time chart of FIG. 3.

If prior to input of the drive signal, the emergency shutdown switch $SW_A$ and the normal shutdown switch $SW_B$ are both off, then an output signal AC is generated from the photocoupler 41 of the monitor circuit 40, and an OFF verification signal Y for the emergency shutdown switch $SW_A$ is generated via the break contact point $r_1$ of the emergency shutdown switch $SW_A$ which is on. In this condition, when a drive signal is input to the emergency shutdown switch control circuit 20, an output is generated from the AND gate 22. By means of this output, the self hold circuit 23 self holds the trigger signal and generates an output, thus driving the relay driver 24 so that the control signal Z is generated from the off-delay circuit 25 and the emergency shutdown switch $SW_A$ comes on. On the other hand, with the normal shutdown switch control circuit 30, the other make contact point $r_2$ of the emergency shutdown switch $SW_A$ comes on so that the drive signal is input to the on-delay circuit 31, and after an on-delay time $T_{ON}$, the oscillator 32 is driven so that a control signal X is generated and the normal shutdown switch $SW_B$ comes on. At this point in time, the load current is supplied to the load 12 from the power supply 11.

On commencement of power supply to the load 12, the control signal X as shown in FIG. 3 goes off for $\Delta t$ for each period $T_Z$, and hence following this the normal shutdown switch $SW_B$ goes off for $\Delta t$. When the normal shutdown switch $SW_B$ goes off, the output signal AC from the photocoupler 41 of the monitor circuit 40 is generated. If the normal shutdown switch $SW_B$ goes off periodically in a normal manner, then an output is generated continuously from the off-delay circuit 21 so that the emergency shutdown switch $SW_A$ is maintained in the ON condition.

When the drive signal stops, then the control signal X of the normal shutdown switch control circuit 30 stops immediately so that the normal shutdown switch $SW_B$ goes off and the power supply to the load 12 is stopped. Then, after the off-delay time $T_{OFF}$ of the off-delay circuit 25, the control signal Z of the emergency shutdown switch control circuit 20 stops and the emergency shutdown switch $SW_A$ goes off.

If during load power supply, a short circuit fault occurs in the normal shutdown switch $SW_B$, then the output signal AC is not generated from the monitor circuit 40. Therefore the control signal Z from the emergency shutdown switch control circuit 20 stops and the emergency shutdown switch $SW_A$ goes off, thus forcibly stopping the power supply to the load 12.

With such a construction, the fact that the normal shutdown switch $SW_B$ can switch off during power supply to the load 12 is continuously verified, and hence the situation as with the conventional arrangement wherein a short circuit fault in the normal shutdown switch $SW_B$ cannot be known unless the drive signal is stopped does not arise. Furthermore, if during input of the drive signal the normal shutdown switch $SW_B$ has a short circuit fault, the output can be shut off immediately. There is thus the advantage that a delay in the off response of the emergency shutdown switch $SW_A$ can be prevented.

FIG. 4 through FIG. 7 show a second embodiment of the present invention. Parts the same as for the first embodiment are denoted by the same symbols and description is omitted.

With the load drive circuit of this embodiment, semiconductor switches are used for the normal shutdown switches, a parallel circuit of two normal shutdown switches being connected in series with an emergency shutdown switch. By alternately ON/OFF driving the two normal shutdown switches, the fact that the normal shutdown switches can switch off without stopping power supply to the load during load power supply is verified.

FIG. 4 shows the overall circuit diagram.

In FIG. 4, a parallel circuit of first and second normal shutdown switches $SW_{B1}$, $SW_{B2}$ comprising semiconductor switches is connected in series with an emergency shutdown switch $SW_A$, to thus make up a load power supply circuit. The normal shutdown switches $SW_{B1}$, $SW_{B2}$ are driven alternately ON and OFF as shown by the time chart of FIG. 5 by means of a normal shutdown switch control circuit 70 which generates two phase signals X, $\overline{X}$ (the negation signal of signal X) having a mutually complementary output relationship, based on input of a drive signal.

An emergency shutdown switch control circuit 60 is constructed such that the emergency shutdown switch $SW_A$ comes on based on verification that the normal shutdown switches $SW_{B1}$, $SW_{B2}$ are both off, after which the normalcy of the normal shutdown switches $SW_{B1}$, $SW_{B2}$ is verified by monitoring the switching operation (ON/OFF operation) of the normal shutdown switches $SW_{B1}$, $SW_{B2}$, to permit the emergency shutdown switch $SW_A$ to remain on. That is to say, under the condition that an output signal $V_{OFF}$ indicating the off condition is input from a monitor circuit 51 for monitoring that the normal shutdown switches $SW_{B1}$, $SW_{B2}$ are both off, then when the drive signal is input, a control signal Z is output so that the emergency shutdown switch $SW_A$ is driven on. After this, under the condition that signals AC1, AC2 indicating the alternate ON/OFF switching are input from monitoring circuits 52, 53 for monitoring the switching operation (ON/OFF operation) of the respective normal shutdown switches $SW_{B1}$, held in the ON condition.

Figure 6:
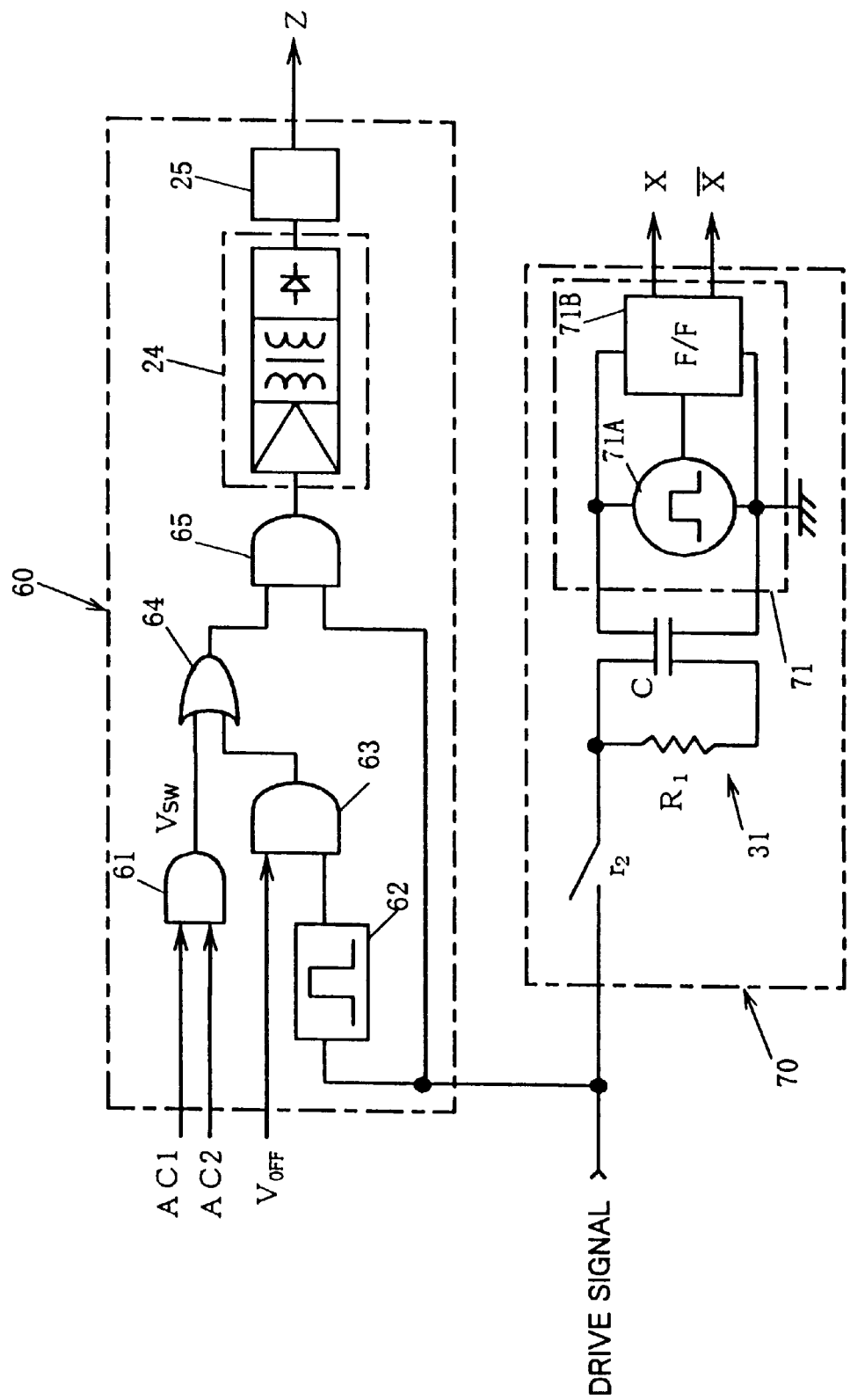
FIG. 6 is an emergency and normal shutdown switch control circuit diagram for the circuit of FIG. 4.

FIG. 6 shows a specific construction example for the emergency shutdown switch control circuit 60 and the normal shutdown switch control circuit 70.

In FIG. 6, the emergency shutdown switch control circuit 60 comprises; an AND gate 61 into which is input the output signals AC1, AC2 from the monitoring circuits 52, 53, a rising detection circuit 62 for detecting the rising of the drive signal, an AND gate 63 into which is input the output from the rising detection circuit 62 and the output signal $V_{OFF}$ from the monitor circuit 51, an OR gate 64 into which is input the respective outputs from the AND gates 61 and 63, an AND gate 65 into which is input the output from the OR gate 64 and the drive signal, and a relay driver 24 and an off-delay circuit 25 similar to those described for the first embodiment.

The normal shutdown switch control circuit 70 is of similar construction to that of the first embodiment, comprising a make contact point $r_2$ of the emergency shutdown switch $SW_A$, an on-delay circuit 31 comprising a resistor $R_1$ and a four terminal capacitor C, and a two phase signal generating circuit 71 for generating two phase signals X, $\overline{X}$ which have a mutually complementary relationship. The two phase signal generating circuit 71 which generates an oscillation output comprises an oscillator 71A with the output from the on-delay circuit 31 based on the drive signal as a power supply, and a flip-flop circuit 71B. Here the two phase signal generating circuit 71 corresponds to a drive device.

Figure 7:
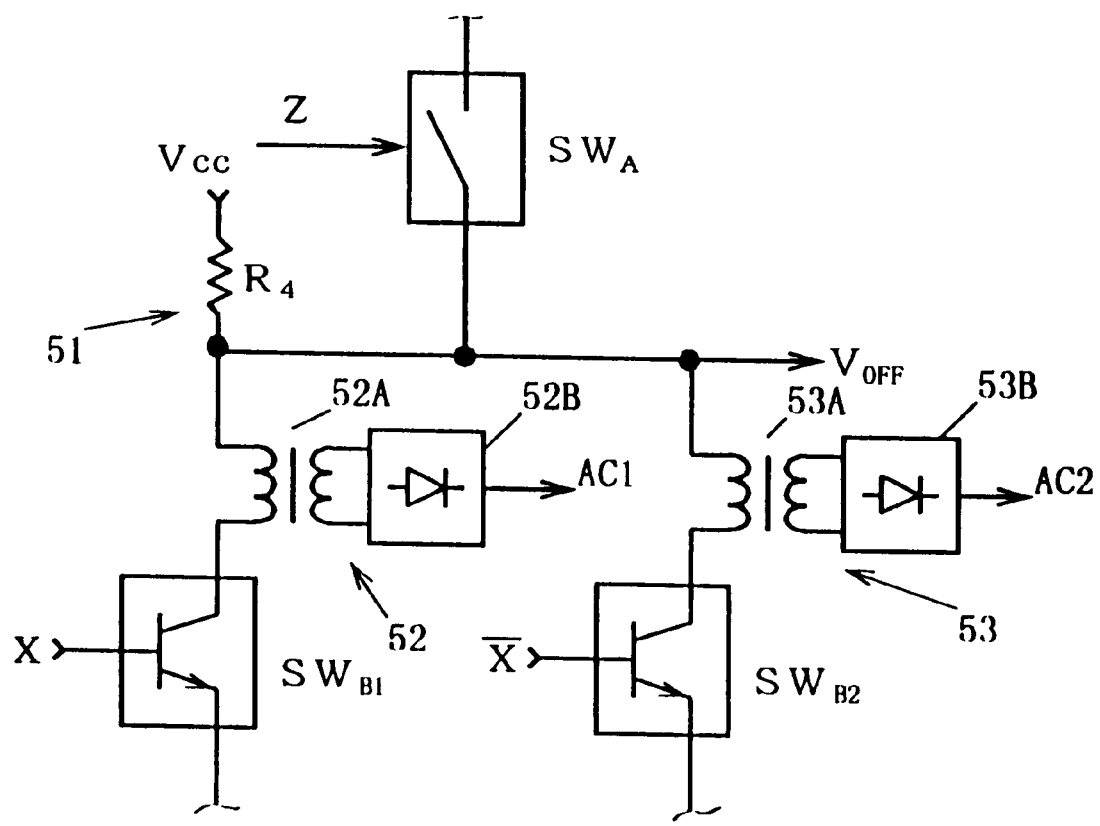
FIG. 7 is a monitoring circuit diagram for the circuit of FIG. 4.

FIG. 7 shows a basic construction example of the respective monitor circuits 51–53 for the respective normal shutdown switches $SW_{B1}$, $SW_{B2}$ which comprise transistors.

In FIG. 7, the monitor circuit 51 comprises a constant voltage Vcc connected via a resistor $R_4$ to a power supply line between the emergency shutdown switch $SW_A$ and the normal shutdown switches $SW_{B1}$, $SW_{B2}$. Furthermore, the monitor circuits 52, 53 corresponding to first and second OFF verification devices have a similar construction, and are respectively constituted by current sensors 52A, 53A and rectifying circuits 5213, 53B. Consequently, the monitoring device is made up of the before mentioned two phase signal generating circuit 71 and the monitoring circuits 52, 53.

Next is a description of the operation.

Figure 5:
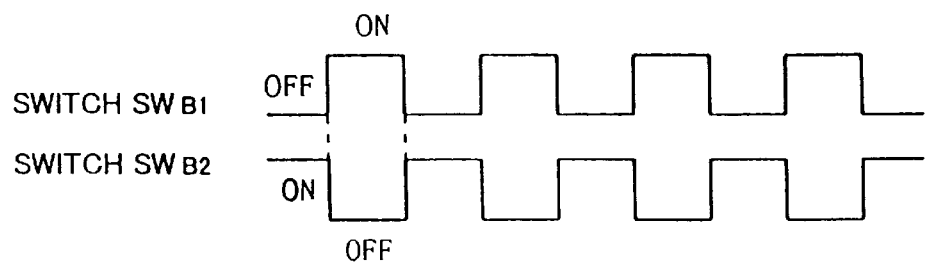
FIG. 5 is an operational time chart for the normal shutdown switch of FIG. 4.

If prior to input of the drive signal, the two normal shutdown switch $SW_{B1}$, $SW_{B2}$ are both off, then the power source potential Vcc is applied via the resistor $R_4$, and an output signal $V_{OFF}$ is generated from the monitor circuit 51. When in this condition a drive signal is input to the emergency shutdown switch control circuit 60, then the output from the rising detection circuit 62 based on the rising of the drive signal is input to the AND gate 63 and an output is thus generated from the AND gate 63. The output from the OR gate 64 based on the output from the AND gate 63 is then applied to the AND gate 65, and by means of this output and the drive signal, an output is generated from the AND gate 65 so that a control signal Z is generated from the relay driver 24 and the off-delay circuit 25, causing the emergency shutdown switch $SW_A$ to come on. On the other hand, with the normal shutdown switch control circuit 70, the make contact point $r_2$ comes on due to excitation of the emergency shutdown switch $SW_A$, so that the drive signal is input to the on-delay circuit 31, and after an on-delay time $T_{ON}$, an output from the on-delay circuit 31 is input to the two phase signal generating circuit 71. In this way, the oscillator 71A is operated so that control signals X, $\overline{X}$ having a mutually complementary relationship are generated via the flip-flop circuit 71B, and as shown in FIG. 5, the normal shutdown switches $SW_{B1}$, $SW_{B2}$ are alternately switched on to thereby supply the load current to the load 12 from the power supply 11.

During power supply to the load 12, the switching operation of the normal shutdown switches $SW_{B1}$, $SW_{B2}$ is monitored by the monitor circuits 52, 53, and when normal, the signals AC1, AC2 are generated together. That is to say, provided that the normal shutdown switches $SW_{B1}$, $SW_{B2}$ are alternately switched on an off, then respective AC signals flow in the current sensors 52A, 53A so that the output signals-AC1, AC2 are generated from the rectifying circuits 52B, 53B. In this way, a signal $V_{SW}$ indicating that the normal shutdown switches $SW_{B1}$, $SW_{B2}$ are both normal is generated from the AND gate 61. Therefore, while the signal $V_{OFF}$ is terminated by the ON/OFF operation of the normal shutdown switches $SW_{B1}$, $SW_{B2}$, so that the output from the AND gate 63 stops, the output from the OR gate 64 continues so that the ON operation of the emergency shutdown switch $SW_A$ is held.

When the drive signal is terminated, then as with the first embodiment, the normal shutdown switches $SW_{B1}$, $SW_{B2}$ go off so that the power supply to the load 12 is stopped, after which the emergency shutdown switch $SW_A$ goes off.

If during power supply to the load 12, one of the normal shutdown switches $SW_{B1}$, $SW_{B2}$ has a short circuit fault, then an AC signal does not flow in the corresponding current sensor 52A or 53A, so that the output signal AC1 or AC2 from the rectifying circuit 52B or 53B stops, and the emergency shutdown switch $SW_A$ goes off, thereby forcibly stopping power supply to the load 12. After this, an OFF verification output signal $V_{OFF}$ for the normal shutdown switches $SW_{B1}$, $SW_{B2}$ is not generated from the monitor circuit 51 due to the short circuit fault in the normal shutdown switch, and hence ON drive of the emergency shutdown switch $SW_A$ becomes impossible (lock out).

Next is a description of a third embodiment of the present invention.

With the third embodiment, a mechanical type switch such as an electromagnetic relay is used for the normal shutdown switch. When a mechanical type switch is used, the switching response speed is slow compared to with a semiconductor switch, so that ON/OFF switching at high speed is difficult. Consequently in carrying out OFF verification for the normal shutdown switch during load driving, then as with the second embodiment shown in FIG. 4, two normal shutdown switches connected in parallel are alternately switched on and off. Moreover, so that the load current is not interrupted when the normal shutdown switch goes off, one of the normal shutdown switches is not switched off until the other normal shutdown switch is switched on. To ensure this, the deviations in the responsiveness of the respective mechanical type switches are taken into consideration so that the ON periods of the respective normal shutdown switches overlap each other.

Figure 8:
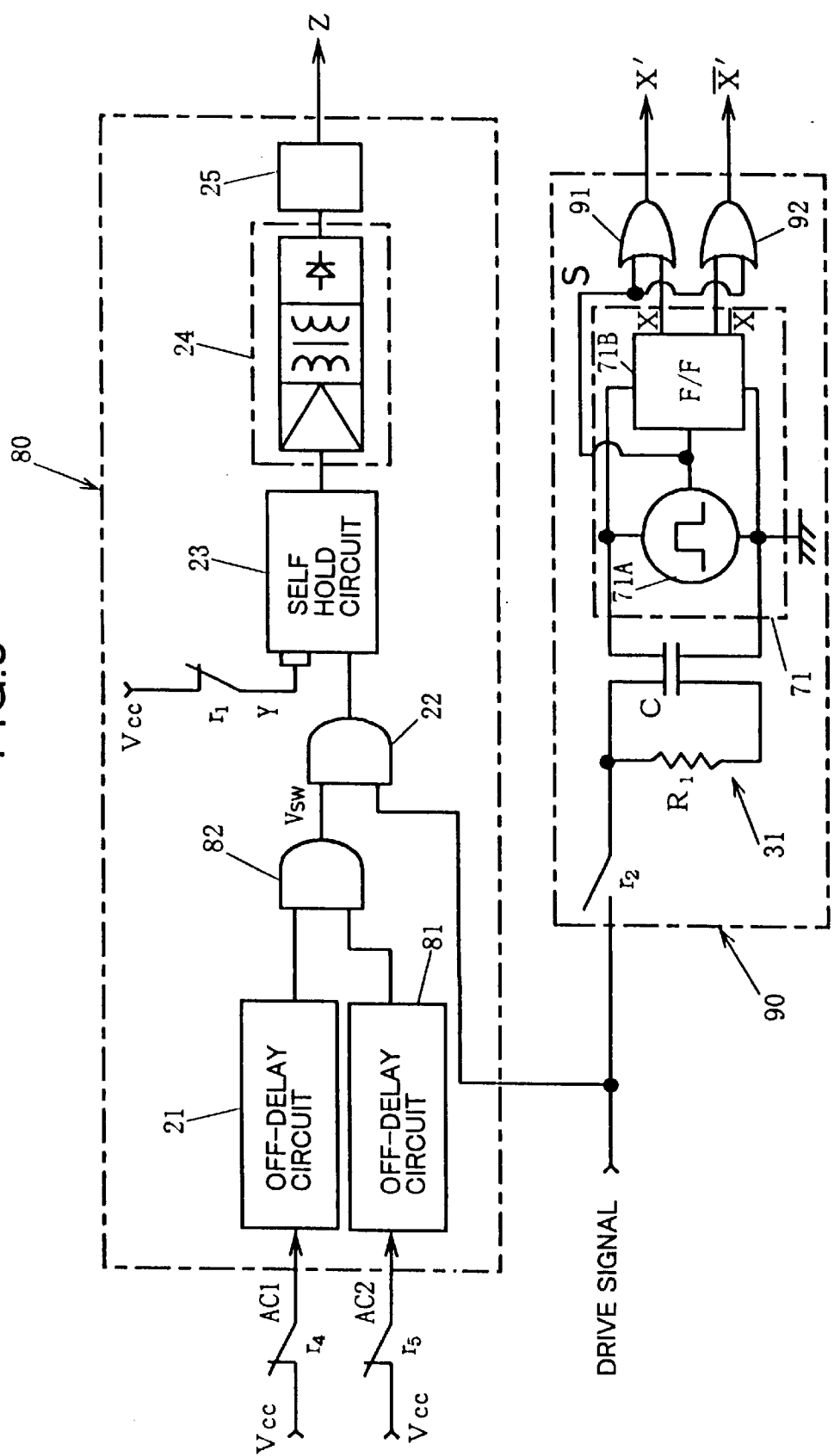
FIG. 8 is an emergency and normal shutdown switch control circuit diagram for the third embodiment of the present invention.

FIG. 8 shows a specific circuit construction example for an emergency shutdown switch control circuit and a normal shutdown switch control circuit of the third embodiment. With the construction of the load power supply circuit, a power supply 11, a load 12, an emergency shutdown switch $SW_A$, and respective normal shutdown switches $SW_{B1}$, $SW_{B2}$ comprising make contact points of for example a forced operation type electromagnetic relay are connectedly arranged as with the second embodiment shown in FIG. 4.

In FIG. 8, an emergency shutdown switch circuit 80 of the present embodiment has approximately the same construction as that of the first embodiment shown in FIG. 2, with an off-delay circuit 81 and an AND gate 82 added.

A normal shutdown switch control circuit 90 has approximately the same construction as that of the second embodiment shown in FIG. 6, with two OR gates 91, 92 added. The respective OR gates 91, 92 take the respective inputs of the complementary output signals X, $\overline{X}$ from the flip-flop circuit 71B of the two phase signal generating circuit 71 and an output signal S from the oscillator 71A. The corresponding normal shutdown switch $SW_{B1}$, $SW_{B2}$ are then driven by means of control signals X', $\overline{X}'$ based on the logical sum outputs from the respective OR gates 91, 92. Incidentally, oscillator 71A of the present embodiment generates a signal as shown in FIG. 9 wherein the ON/OFF duty ratio is not 50%.

Figure 9:
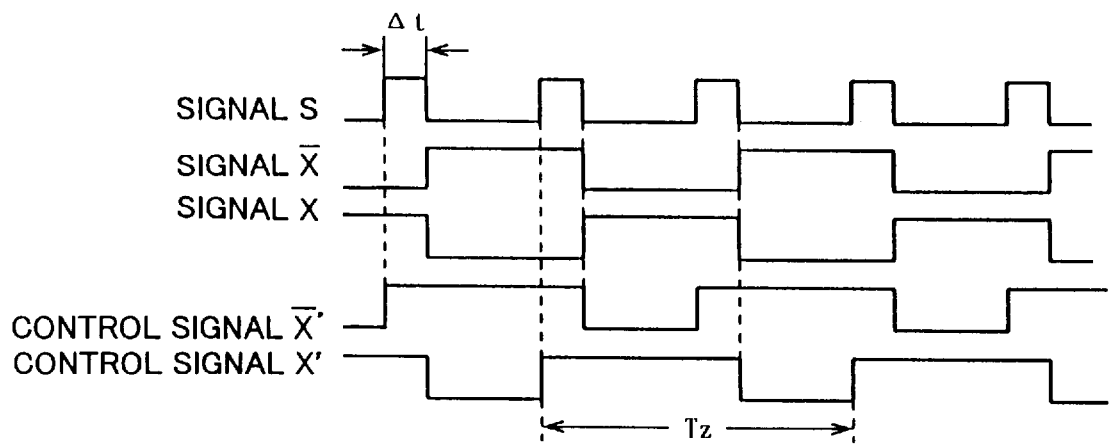
FIG. 9 is a diagram of the generation of control signals X', X'.

The control signals X', $\overline{X}'$ in the normal shutdown switch control circuit 90 are generated as shown in FIG. 9 with the ON periods overlapping each other by Δt. That is to say, signals of pulse width Δt are generated from the oscillator 71A, and the flip-flop circuit 71B which frequency divides the signals from the oscillator 71A count at the failing thereof to thus generate mutually complementary output signals X', $\overline{X}$. Consequently, the output signals of pulse width Δt from the oscillator 71A and the control signals X, $\overline{X}'$ generated from the respective OR gates 91, 92, being the logical sums of the output signals X, $\overline{X}$ from the flip-flop circuit 71B, are alternately generated as shown in FIG. 9 with an overlap period of Δt. OFF verification of the normal shutdown switches $SW_{B1}$, $SW_{B2}$ is carried out using respective break contact points $r_4$, $r_5$.

Figure 10:
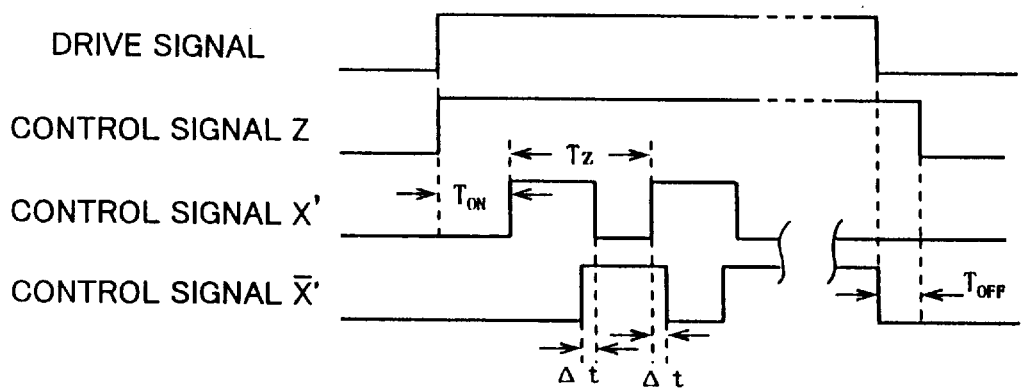
FIG. 10 is an operational time chart for the third embodiment.

Next is a description of the operation of the third embodiment, with reference to the time chart of FIG. 10.

If prior to input of the drive signal, the emergency shutdown switch $SW_A$ and the two normal shutdown switches $SW_{B1}$, $SW_{B2}$ are both off, then the respective break contact points $r_1$, $r_4$, $r_5$ are on. Therefore, the OFF verification signal Y for the emergency shutdown switch $SW_A$ and the output signals AC1, AC2 for OFF verification of the normal shutdown switches $SW_{B1}$, $SW_{B2}$ are generated. When in this condition a drive signal is input to the emergency shutdown switch control circuit 80, then due to the output from the AND gate 82 and the input of the drive signal, an output is generated from the AND gate 22 so that the self hold circuit 23 generates a control signal Z via the relay driver 24 and the off-delay circuit 25, causing the emergency shutdown switch $SW_A$ to come on.

On the other hand, with the normal shutdown switch control circuit 90, then as with the second embodiment, after an on-delay time $T_{ON}$, the two phase signal generating circuit 71 is operated so that control signals X', $\overline{X}'$ which overlap each other in the ON period as mentioned before, are generated. As a result, the operation is such that while one of the normal shutdown switches $SW_{B1}$ (or $SW_{B2}$) is on, the other of the normal shutdown switches $SW_{B2}$ (or $SW_{B1}$) comes on, after which the one of the normal shutdown switches $SW_{B1}$ (or $SW_{B2}$) goes off. In this way, the respective normal shutdown switches $SW_{B1}$, $SW_{B2}$ are alternately switched on and off to thereby supply the load current to the load 12 from the power supply 11.

After commencement of power supply to the load 12, then if normal, due to the continuous output from the off-delay circuits 21, 81, the output from the AND gate 82 is continuous so that the emergency shutdown switch $SW_A$ is maintained in the ON condition. If during load power supply, a short circuit fault occurs in one of the normal shutdown switches $SW_{B1}$, $SW_{B2}$, the output from the AND gate 82 stops, and the emergency shutdown switch $SW_A$ goes off, thus forcibly stopping the power supply to the load 12.

If in this way, in the case where a mechanical type switch such as an electromagnetic relay is used for the normal shutdown switches $SW_{A1}$, $SW_{B2}$, the ON periods overlap each other, then the operation is stable. Moreover when switching one of the normal shutdown switches on or off, since this carried out with the voltage between the contact points approximately zero, then discharge is minimal so that the life of the switch can be extended.

When the load power supply is an alternating current, then if the switching of the normal shutdown switch is carried out in the vicinity of the zero point of the load current, the load current will be minimal and hence the loading on the normal shutdown switch can be minimized so that the life of the normal shutdown switch can be further extended.

With the present invention as described above, since even during load power supply it can be verified whether or not the normal shutdown switch is normal, then the situation as with the conventional circuit wherein an ON fault in the normal shutdown switch cannot be discovered until the drive signal is terminated does not arise. Furthermore, when a fault occurs in the normal shutdown switch, an immediate danger avoidance operation is possible without any response delay, and the problem of response delay of the emergency shutdown switch as with the conventional circuit can also be eliminated.

Moreover, if a semiconductor switch is used for the normal shutdown switch, then the normal shutdown switch can be driven on and off at high speed with essentially no stopping of the load current. There is thus the advantage that only one normal shutdown switch is needed.

Furthermore, even in the case where a mechanical type switch such as an electromagnetic relay is used for the normal shutdown switch, since two normal shutdown switches are alternately driven on and off, the current can be made to flow continuously and reliably in the load power supply circuit so that the drive of the load can be stable.

Moreover, if the ON drive signal for the emergency shutdown switch is generated continuously on the condition that during load power supply the normal shutdown switch is normal, then if an ON fault occurs in the normal shutdown switch during load power supply, the emergency shutdown switch is forcibly switched off, and hence the power supply to the load can be stopped immediately.

When a mechanical type contact point switch such as an electromagnetic relay wherein the ON/OFF response speed is slow is used for the normal shutdown switch, then by overlapping the ON period at the time of switching the switch, the drive of the ON/OFF drive of the two normal shutdown switches can be further stabilized, and the load on the mechanical type contact point switch can be reduced during ON/OFF switching so that the life can be extended.

With the present invention, the fail-safe characteristics at the time of a fault in a load drive circuit incorporating an emergency shutdown switch and a normal shutdown switch is improved. The safety of an operator can thus be significantly improved.

We claim:

1. A load drive circuit comprising:
    an emergency shutdown switch;
    a normal shutdown switch; and
    a load power supply circuit,
    wherein the emergency shutdown switch and normal shutdown switch comprise a series circuit, and further wherein the series circuit is further connected in series with the load power supply circuit,
        further wherein the emergency shutdown switch switches on simultaneously with generation of a load drive signal and switches off after a predetermined off-delay time from a termination of the load drive signal,
        further wherein the normal shutdown switch switches on after a predetermined on-delay time from the generation of said drive signal and switches off simultaneously with the termination of said drive signal, and
        further wherein monitoring means is provided for monitoring an ability of the normal shutdown switch to be switched off during load power supply.

2. A load drive circuit according to claim 1, wherein when the normal shutdown switch is a semiconductor switch, said monitoring means comprises OFF signal generating means for periodically generating an OFF drive signal for switching off said normal shutdown switch for a period of time so short that the load current is not stopped, and OFF verification means for generating an output signal when said normal shutdown switch is switched off.

3. A load drive circuit according to claim 1, wherein when said normal shutdown switch comprises first and second normal shutdown switches connected in parallel with each other, said monitoring means comprises drive means for generating output signals having a mutually complementary relationship for alternately ON/OFF driving said first and second normal shutdown switches, and first and second OFF verification means for generating an OFF verification signal when said first and second normal shutdown switches are respectively switched off.

4. A load drive circuit according to claim 3, wherein there is provided emergency shutdown switch control means for continuously generating an ON drive signal for said emergency shutdown switch on the condition that an OFF verification signal is being alternately generated from said first and second OFF verification means.

5. A load drive circuit according to claim 4, wherein said emergency shutdown switch control means is constructed such that the ON drive signal for said emergency shutdown switch is generated with the input of said drive signal on the condition that an OFF verification signal indicating that the two normal shutdown switches are both off is being generated, and after this, the ON drive signal for said emergency shutdown switch is continuous on the condition that an OFF verification signal is being alternately generated from said first and second OFF verification means.

6. A load drive circuit according to claim 3, wherein when said first and second normal shutdown switches are mechanical type contact point switches, then at the time of ON/OFF switching of the first and second normal shutdown switches, the first and second normal shutdown switches are drive controlled so that the mutual switch ON periods overlap.

7. A load drive circuit according to claim 7, wherein said emergency shutdown switch is switched on with the input of said drive signal on the condition that a signal indicating that said normal shutdown switch is switched on after the predetermined on-delay time to supply power to the load.

* * * * *